US012197731B2

(12) United States Patent
Ware et al.

(10) Patent No.: US 12,197,731 B2
(45) Date of Patent: *Jan. 14, 2025

(54) MEMORY SYSTEM WITH THREADED TRANSACTION SUPPORT

(71) Applicant: Rambus Inc., San Jose, CA (US)

(72) Inventors: Frederick A. Ware, Los Altos Hills, CA (US); Ely Tsern, Los Altos, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/492,296

(22) Filed: Oct. 23, 2023

(65) Prior Publication Data

US 2024/0111423 A1    Apr. 4, 2024

Related U.S. Application Data

(63) Continuation of application No. 17/586,575, filed on Jan. 27, 2022, now Pat. No. 11,809,712, which is a
(Continued)

(51) Int. Cl.
*G06F 3/06* (2006.01)
*G06F 12/06* (2006.01)
(Continued)

(52) U.S. Cl.
CPC .......... *G06F 3/0611* (2013.01); *G06F 3/0619* (2013.01); *G06F 3/0634* (2013.01);
(Continued)

(58) Field of Classification Search
CPC .. G06G 3/0611; G06G 3/0619; G06G 3/0634; G06G 3/0659; G06G 3/0673; G06F 12/0607; G11C 5/04; G11C 7/10
See application file for complete search history.

(56) References Cited

U.S. PATENT DOCUMENTS

| 6,742,098 B1 | 5/2004 | Halbert et al. |
| 2005/0007805 A1 | 1/2005 | Ware et al. |

(Continued)

OTHER PUBLICATIONS

Notification of Transmittal of The International Search Report and the Written Opinion of the International Searching Authority, or the Declaration with mail date of Feb. 12, 2016 re Int'l Appln. No. PCT/US15/066816. 17 Pages.

*Primary Examiner* — Aracelis Ruiz

(74) *Attorney, Agent, or Firm* — Lance Kreisman; Peninsula Patent Group

(57) ABSTRACT

Memory modules, systems, memory controllers and associated methods are disclosed. In one embodiment, a memory module includes a module substrate having first and second memory devices. Buffer circuitry disposed on the substrate couples to the first and second memory devices via respective first and second secondary interfaces. The buffer circuitry includes a primary signaling interface for coupling to a group of signaling links associated with a memory controller. The primary signaling interface operates at a primary signaling rate and the first and second secondary data interfaces operate at a secondary signaling rate. During a first mode of operation, the primary interface signaling rate is at least twice the secondary signaling rate. A first time interval associated with a transfer of first column data via the first secondary interface temporally overlaps a second time interval involving second column data transferred via the second secondary interface.

20 Claims, 7 Drawing Sheets

Related U.S. Application Data continuation of application No. 16/805,535, filed on Feb. 28, 2020, now Pat. No. 11,249,649, which is a continuation of application No. 15/529,970, filed as application No. PCT/US2015/066846 on Dec. 18, 2015, now Pat. No. 10,592,120.

(60) Provisional application No. 62/094,306, filed on Dec. 19, 2014.

(51) Int. Cl.
*G11C 5/04* (2006.01)
*G11C 7/10* (2006.01)

(52) U.S. Cl.
CPC .......... *G06F 3/0659* (2013.01); *G06F 3/0673* (2013.01); *G06F 12/0607* (2013.01); *G11C 5/04* (2013.01); *G11C 7/10* (2013.01)

(56) References Cited

U.S. PATENT DOCUMENTS

| | | |
|---|---|---|
| 2010/0121994 A1 | 5/2010 | Kim et al. |
| 2011/0138133 A1 | 6/2011 | Shaeffer |
| 2011/0219197 A1 | 9/2011 | Perego et al. |
| 2012/0191943 A1 | 7/2012 | Ware |
| 2012/0240010 A1 | 9/2012 | Wang et al. |
| 2013/0036273 A1 | 2/2013 | Shaeffer |
| 2013/0083611 A1 | 4/2013 | Ware et al. |
| 2013/0254495 A1 | 9/2013 | Kim et al. |
| 2014/0337645 A1 | 11/2014 | Ware et al. |
| 2014/0351629 A1 | 11/2014 | Ware et al. |
| 2018/0157606 A1* | 6/2018 | Schroder ............... G06F 12/109 |

* cited by examiner

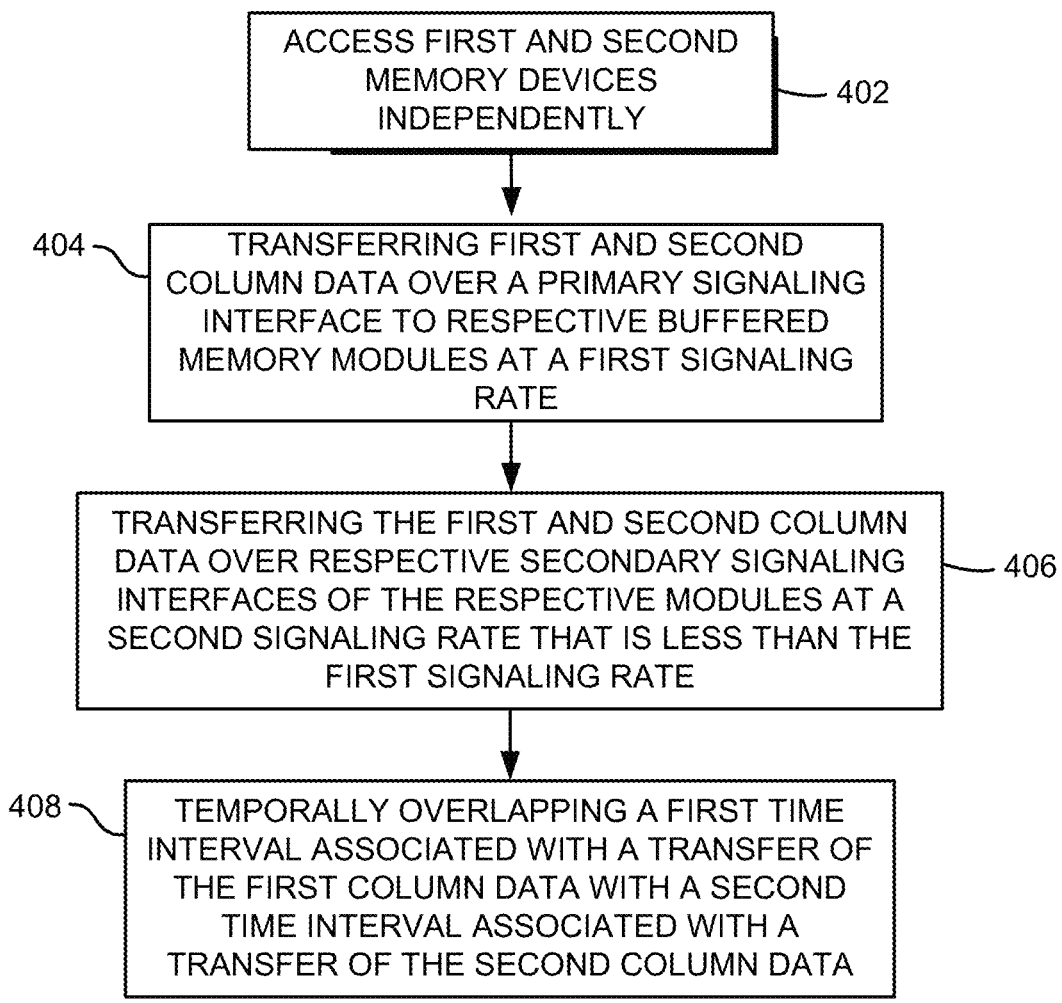

MEMORY SYSTEM WITH THREADED TRANSACTION SUPPORT

CROSS REFERENCES TO RELATED APPLICATIONS

This application is a Continuation of U.S. application Ser. No. 17/586,575, filed Jan. 27, 2022, now U.S. Pat. No. 11,809,712, which is a Continuation of U.S. application Ser. No. 16/805,535, filed Feb. 28, 2020, now U.S. Pat. No. 11,249,649, which is a Continuation of U.S. application Ser. No. 15/529,970, filed May 25, 2017, now U.S. Pat. No. 10,592,120, which is a national stage application of international application number PCT/US2015/066846, filed Dec. 18, 2015, which claims the benefit of U.S. Provisional Application No. 62/094,306, filed Dec. 19, 2014, all of which is incorporated by reference herein in its entirety.

TECHNICAL FIELD

The disclosure herein relates to memory systems, and more specifically to buffered memory modules and methods.

BACKGROUND

Memory modules come in a variety of configurations depending on a given application and desired storage capacity. For high-capacity memory modules that utilize significant numbers of memory devices, a buffered architecture is often employed. The buffered approach buffers data transferred between the memory devices and a memory controller, thus reducing loading of a data bus to the relatively few buffer devices, rather than the high number of memory devices. Address and control busses are also typically buffered in these systems.

Conventional buffered memory systems employ primary data paths between the memory controller and buffer(s), and secondary data paths between the buffer(s) and the memory devices. The primary and secondary paths transfer data at the same rate. While this may work adequately for some applications, there may be unused bandwidth if both the primary and secondary buses are locked to the same transfer rate.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 4 illustrates a flowchart of steps for one embodiment of a method of operating the buffered memory module of FIG. 2.

DETAILED DESCRIPTION

Embodiments of integrated circuits, memory modules and associated methods are disclosed herein. In one embodiment, a memory module includes a module substrate having first and second memory devices. Buffer circuitry disposed on the substrate couples to the first and second memory devices via respective first and second secondary interfaces. The buffer circuitry includes a primary signaling interface for coupling to a group of signaling links associated with a memory controller. The primary signaling interface operates at a primary signaling rate and the first and second secondary data interfaces operate at a secondary signaling rate. During a first mode of operation, the primary interface signaling rate is at least twice the secondary signaling rate. A first time interval associated with a transfer of first column data via the first secondary interface temporally overlaps a second time interval involving second column data transferred via the second secondary interface.

In a further embodiment, a memory system is disclosed. The memory system includes a system substrate, a first buffered memory module coupled to the system substrate and a second buffered memory module coupled to the system substrate. Each of the first and second buffered memory modules include a module substrate and first and second memory devices disposed on the module substrate. Buffer circuitry disposed on the substrate couples to the first and second memory devices via respective first and second secondary data interfaces. The buffer circuitry includes a primary data interface for coupling to a group of data links formed on the system substrate. The primary data interface operates at a primary data rate and the first and second secondary data interfaces operate at a secondary data rate. During a first mode of operation, the primary interface data rate is at least twice the secondary data rate, and first column data transferred via the first secondary interface overlaps second column data transferred via the second secondary interface.

In yet another embodiment, a memory controller is disclosed. The memory controller includes a controller primary signaling interface for coupling to at least one buffered memory module via a group of data links. Command generation circuitry dispatches command signals to the least one buffered memory module. During a first mode of operation, a signaling rate of the controller primary signaling interface is twice a rate of the first and second secondary interfaces.

Figure 1:
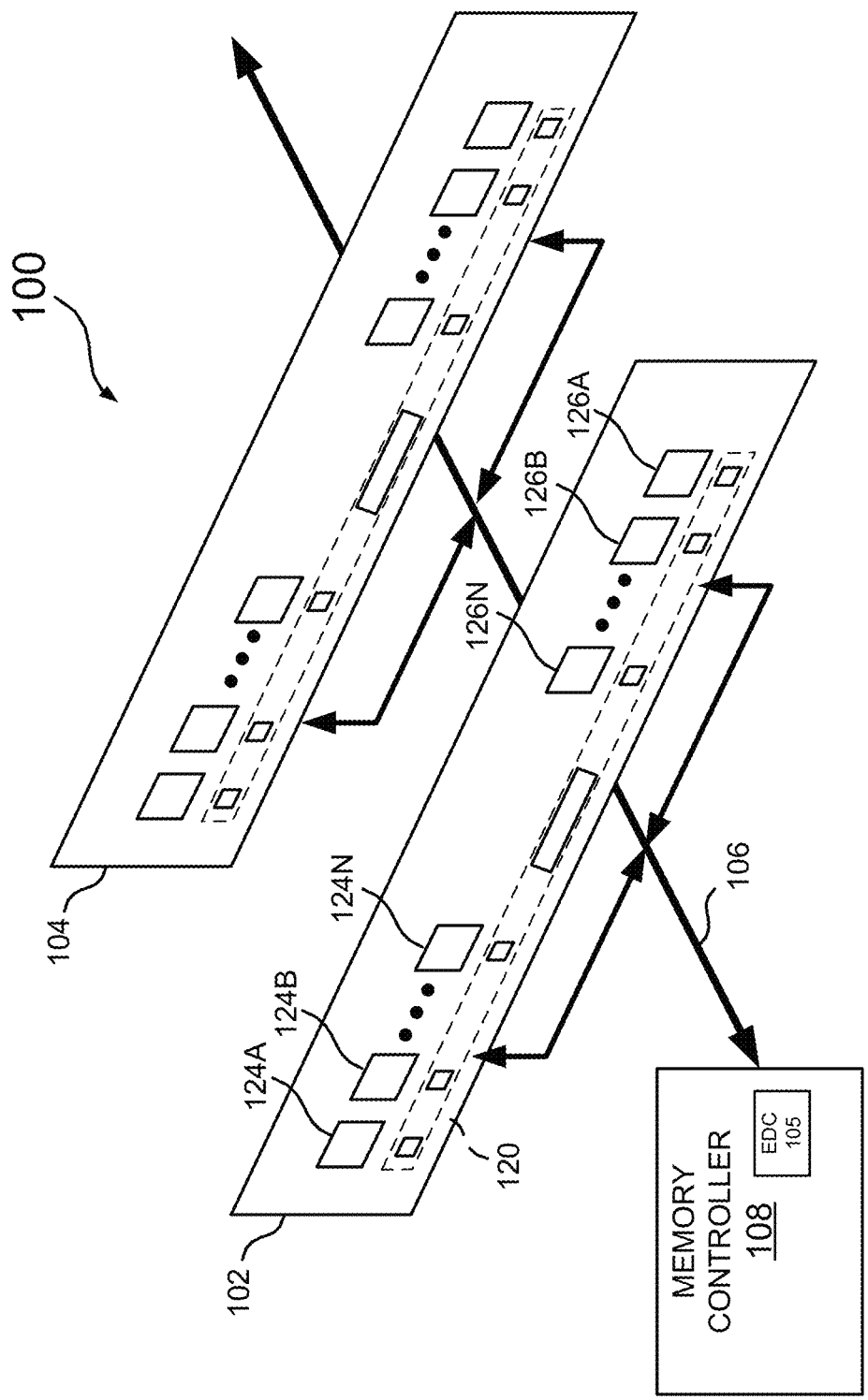
FIG. 1 illustrates one embodiment of a memory system that employs a memory controller and multiple memory modules.

Referring to FIG. 1, one embodiment of a buffered memory architecture, generally designated 100, employs multiple memory modules 102 and 104 coupled to a primary bus 106 that transfers data, command and address signals. Memory control circuitry in the form of a memory controller 108 is also coupled to the primary bus 106 to direct data transfers to and from the modules 102 and 104. The memory control circuitry may include, e.g., a discrete memory controller separate from a requestor integrated circuit (IC). For one embodiment, the memory controller is an IC chip that controls dynamic random access memory (DRAM) devices disposed on the modules 102 and 104. In one embodiment, the memory controller employs EDC circuitry 105 to perform error detection and/or correction on write data and/or read data.

Further referring to FIG. 1, the embodiment shown illustrates a multi-drop bus, where the primary bus 106 is shared by the modules 102 and 104. Point-to-point topologies are also envisioned, illustrated in FIGS. 5-7, and described below. Each module includes buffer circuitry 120, described more fully below, and memory devices 124A-124N and 126A-126N. For one embodiment, the memory devices are DRAM devices. The buffer circuit 120 isolates the memory devices from the primary bus 106 for each module. Thus, instead of the multiple memory devices for each module loading the bus, only the buffer circuits load the bus. This minimizes capacitive loading on the shared primary bus, among other things. As explained more fully below, the buffer circuit 120 may also support error detection and correction (EDC) coding to detect and/or correct errors in data transferred to and from the modules.

Figure 2:
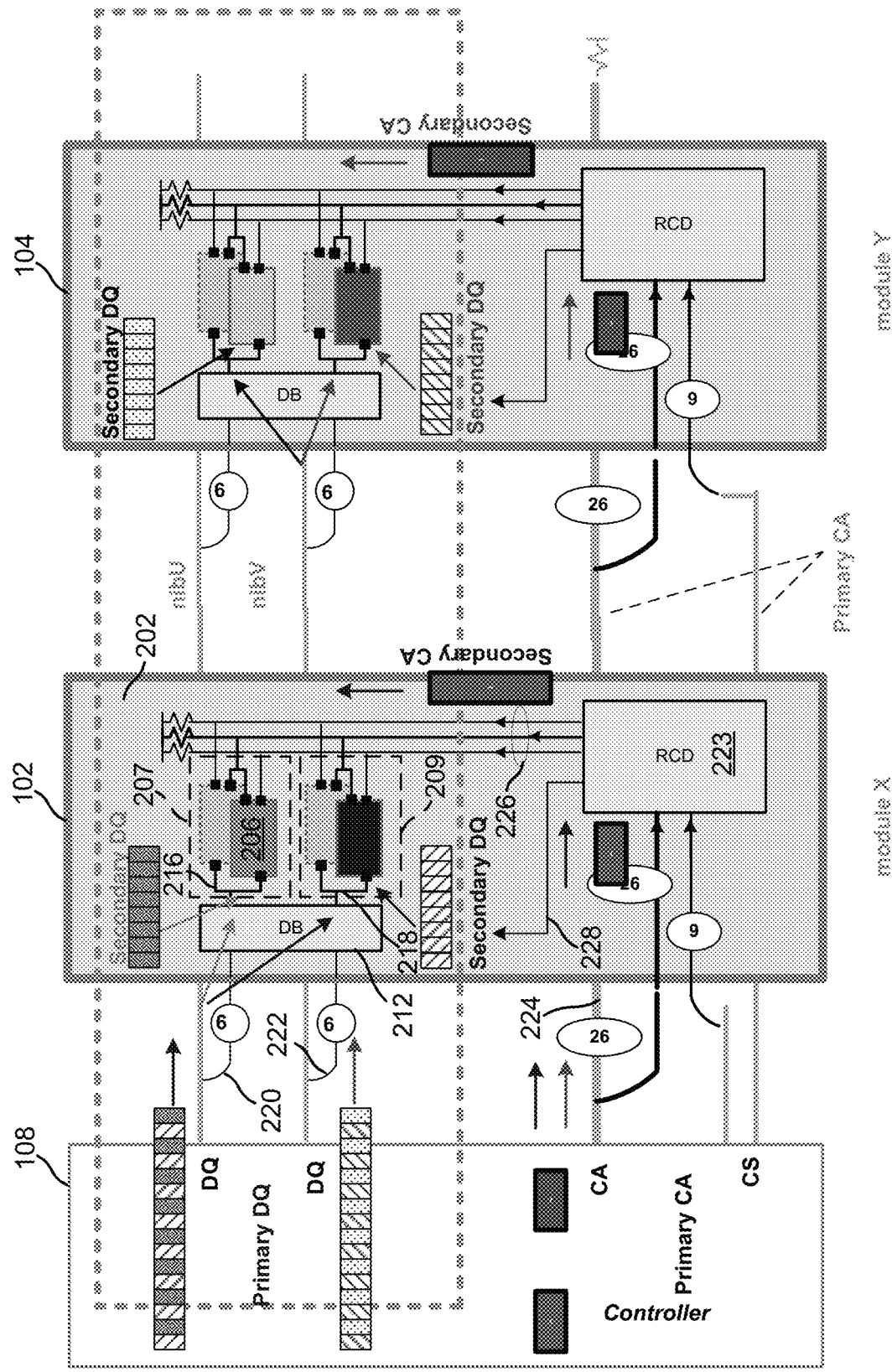
FIG. 2 illustrates one embodiment of a buffered memory module that may be used with the memory system of FIG. 1.

FIG. 2 illustrates additional detail for one embodiment of the memory architecture of FIG. 1, including memory modules 102, 104 and memory controller 108. Each module 102 and 104 includes a substrate 202 having a front face that mounts a plurality of memory devices 206. In some embodiments, the memory devices may organized as "ranks" Typically, a rank corresponds to a set of otherwise separately addressable memory devices used for a single memory access. Only a portion of a single rank is shown in FIG. 2 for each module.

Each memory device 206 may be realized as a single memory chip, or packaged to include plural memory die in a stacked configuration. In some embodiments, an additional set of memory devices may be mounted on the back face of the module, and organized as an additional rank. The memory devices each may include multiple "banks," and all of the banks organized within a given rank of devices. Each bank may be independently accessed via a given bank address.

Further referring to FIG. 2, for one embodiment, a pair of memory devices (or packaged groups of devices) 210 couple to a data buffer 212 via corresponding secondary data busses 216 and 218 that transfer data at a secondary data rate. The data buffer 212, in turn, interfaces with the memory controller 108 through a pair of primary bus data paths 220 and 222 that transfer data at a primary data rate. Each data buffer 212, for one embodiment, manages buffer operations for two "nibbles" of data, with each nibble corresponding to four data paths or "DQs." For one embodiment, a differential strobe signal accompanies each nibble on two strobe paths. As is described more fully below, in one mode, the primary data rate may operate higher than the secondary data rate, and the memory architecture is configured to support the difference in rates. As a result, inexpensive memory devices that operate at slower speeds may be employed by the modules without impacting the performance of the memory system, resulting in reduced hardware costs.

With continued reference to FIG. 2, a command/address (C/A) buffer 223 interfaces with the memory controller 108 through a primary command bus 224, and routes command signals along a secondary command bus 226, to the memory devices 206 in, for example, a "fly-by" manner. A unidirectional buffer communications (BCOM) bus 228 links the C/A buffer circuit 223 to the data buffers 212. For one embodiment, each memory module employs a single C/A buffer 223 embodied as a first integrated circuit (IC) buffer chip, and plural data buffer IC chips 212. The plural data buffer chips may be configured to each support a ×8 (byte or two nibble)) portion of the primary and secondary data busses, and corresponding to one or more dedicated groups 207 and 209 of the memory devices 206. While separate buffer circuits are shown in FIG. 1 for the data and CA buffer circuits, the buffer circuitry may take many different forms, including, for example, a single buffer chip for each memory module that includes both the C/A and data buffer circuitry.

Further referring to FIG. 2, to support a mode where data transfers with the primary and secondary busses operate at different data rates, each data buffer 212 is configured to pass two nibbles of data simultaneously to two groups 207 and 209 of memory devices on a given module. As a result, data transfers for an entire module may be supported with half the primary data paths. Additionally, the memory controller 108 is configured to dispatch column data commands and data to at least two memory modules such that column data transactions overlap in time between the different modules 102 And 104.

For example, and with continued reference to FIG. 2, data transferred along a given nibble (4 paths), such as at 220, of the primary data bus is routed to a corresponding data buffer 212 for a given module 102. To support the increased data rate of the primary bus, the data from the nibble is split and transferred along the secondary bus paths 216 and 218 between groups of memory devices at a rate that is half the rate of the primary bus. Other transfer rates are possible, depending on the application. In this manner, data for separate transactions that are, for example, interleaved along the nibble, may be aggregated in a given group of memory devices at a data rate that is half the data rate of the primary bus. For some embodiments, the data associated with each nibble may not be when transferred along the primary bus.

In other embodiments, the number of modules may vary depending on the application. To support different data rates between the primary and the secondary interfaces, the transferred data may be organized in various ways for transfer along the primary data bus. This allows for effective steering of the data in the multiple modules to effect the reduced data rates along the secondary paths, and the concurrent accesses to the memory devices of the various modules.

Figure 3:
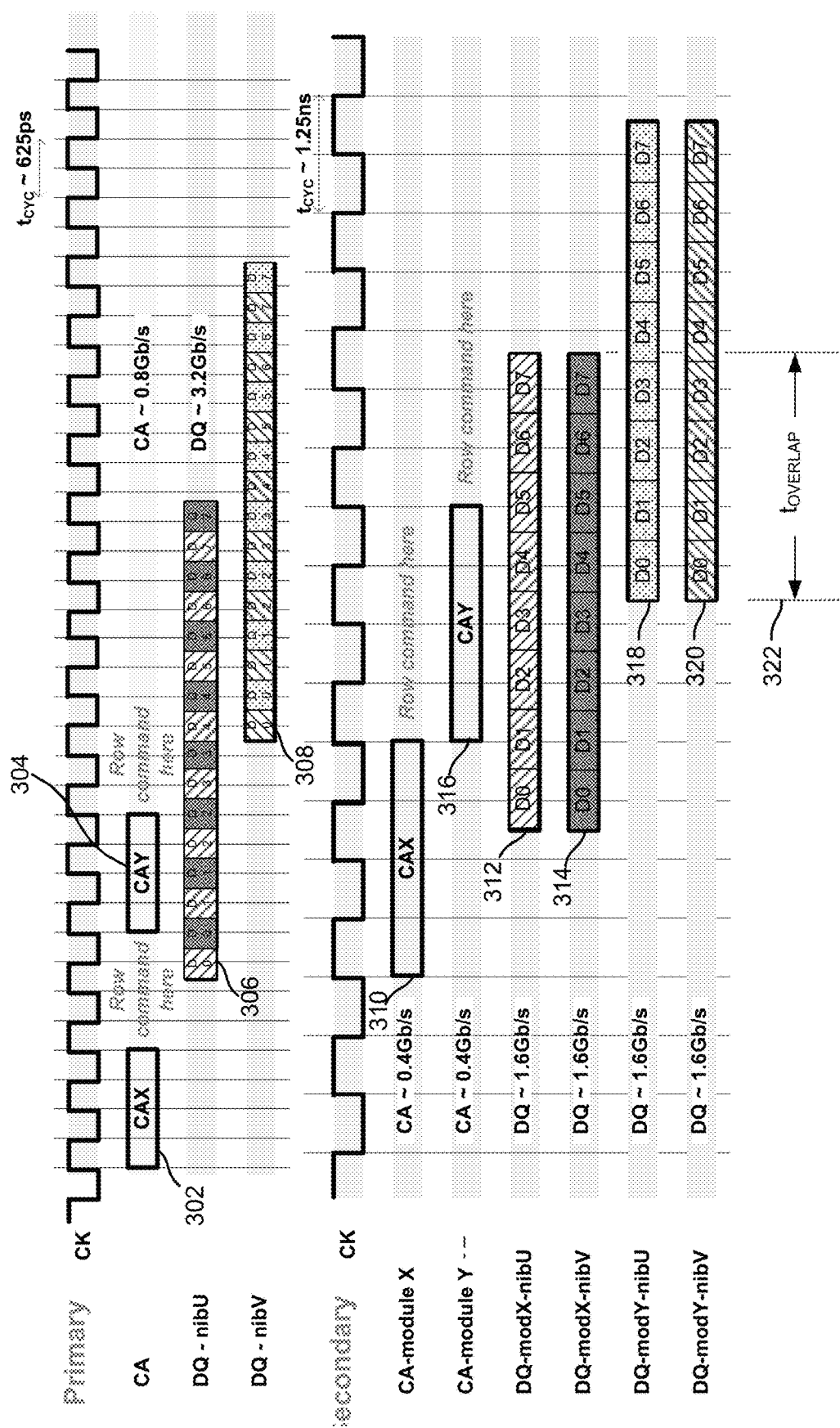
FIG. 3 illustrates a timing diagram of data and command signals associated with the buffered memory module of FIG. 2.

FIG. 3 illustrates a timing chart associated with a set of write operations to more fully explain a mode of operation where the primary and secondary busses operate at different data rates. The waveform CK represents a timing reference for the transfer operations, where every four intervals of the clock corresponds to a column cycle time tCC. A tCC is a timing parameter that represents the minimum time necessary to carry out a column access.

Further referring to FIG. 3, in transferring write data, the memory controller 108 dispatches respective column access commands CAX and CAY, at 302 and 304, to the modules 102 and 104. At 306, a first set of EDC-coded column write data is transferred along a 4-bit (nibble) set of the primary data paths (DQ-nibU) at a first data rate, such as 3.2 Gb/s. The first set of column write data includes first column data that is interleaved with second column data. Each of the first and second column data exhibit bit rates that are half the primary data rate. A second set of column write data begins a data transfer, at 308, along a second 4-bit (nibble) set of the primary data paths (DQ-nibV), at the 3.2 Gb/s data rate.

With continued reference to FIG. 3, at 310, the column access command CAX is re-driven across the secondary CA bus 226 by the CA buffer 222. Following a buffer delay, the interleaved first set of column write data is de-interleaved by the data buffer 212, and the first and second column data transferred along respective secondary busses (DQ-modX-nibU), and (DQ-modX-nibV), at 312 and 314 for writing to separate groups 207 and 209 of memory devices 206 in the first memory module 102 as separate threads. This is carried out at a second data rate that is half the primary data rate, such as 1.6 Gb/s. While the first memory module 102 is carrying out the first column data transfer, the CA buffer on the second memory module 104 re-drives the second column access command CAY, at 316, with the second set of column write data being transferred along the secondary busses of the second memory module 104, at 318 and 320. This is carried out at a data rate that is half the primary bus data rate. The respective first and second column data transfers overlap in time, over a duration $t_{OVERLAP}$, as shown at 322, such that at least a portion of the data transfer operations are carried out concurrently.

The error encoding carried out on the transferred data may be generated in accordance with one of many acceptable EDC algorithms including, for example, straightforward single-bit Hamming codes, to more sophisticated high-speed BCH (Bose, Ray-Chaudhuri and Hocquenghem) codes. Other EDC codes, such as "Chipkill" codes, Reed-Solomon codes, turbo codes, cyclic redundancy codes (CRC) and low density parity check (LDDC) codes may also be acceptable.

FIG. 4 illustrates a flowchart of steps that set out a method of operation consistent with the memory architecture described above. At 402, first and second memory devices on respective memory modules are accessed independently. First and second column data are transferred over respective primary interfaces to the corresponding modules at a first signaling rate, at 404. Following a buffer delay on each module, the first and second column data is then directed over secondary interfaces of the respective modules at a second signaling rate that is less than the first signaling rate, at 406. The concurrency in the multiple module operations results in an overlap of a first time interval associated with the transfer of the first column data with a second time interval associated with a transfer of the second column data, at 408.

The description provided above, relating to the architecture and methods of FIGS. 1-4, relates to a mode of operation where a primary interface data rate is different than a secondary data interface rate. For some embodiments, a further mode of operation is supported that provides reverse compatibility for legacy systems that operate in a conventional manner. For such legacy modes, the primary interface rate may be locked with, or the same as the secondary interface data rate. Moreover, in such a mode, each module may be constrained to a single access at a time, and the secondary data transfer for a first memory module does not overlap a secondary data transfer for a second memory module. Selection of a given mode may be made at system initialization via a programmable interface.

Figure 5A:
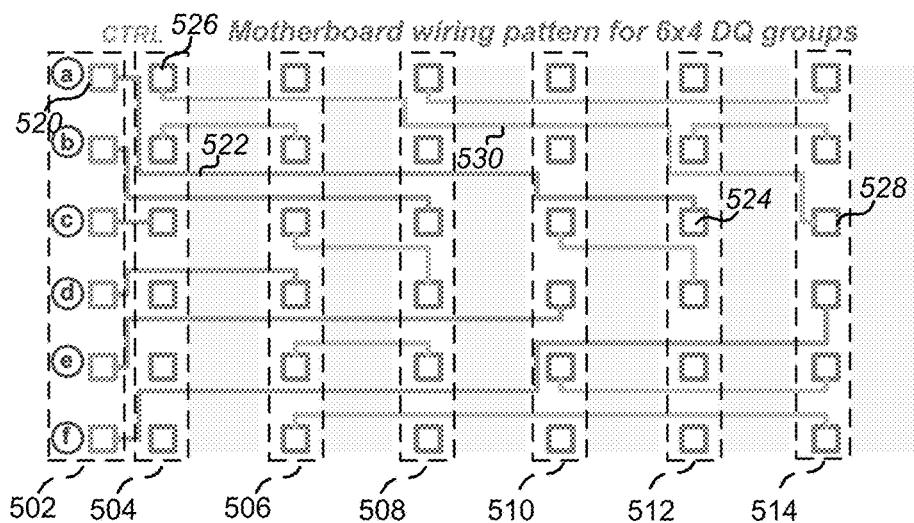
FIGS. 5A-5C illustrate various routing and module configurations for a point-to-point memory system topology employing the buffered memory module of FIG. 2.
Figure 5B:
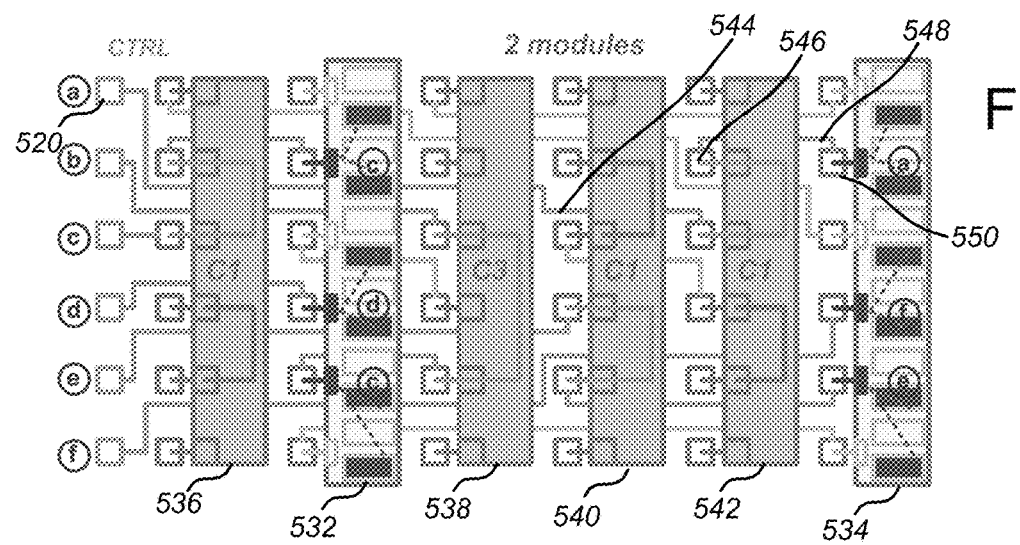
Figure 5C:
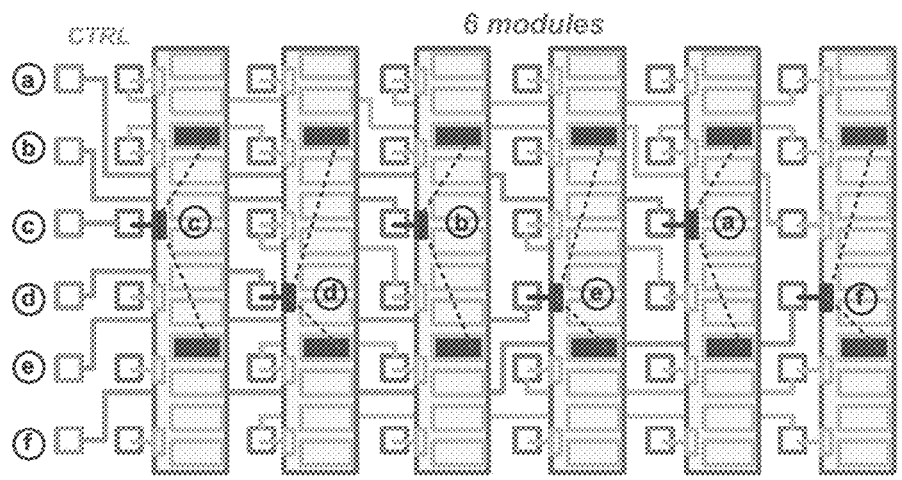

While the memory architecture and methods described above are shown primarily in a multi-drop context, where multiple memory modules are coupled to all of the memory controller input/output (I/O) data paths, point-to-point topologies are also envisioned. FIGS. 5A-5C illustrate several design considerations that allow for point-to-point connections between the memory controller and multiple modules. In such an architecture, a first set of I/Os from the memory controller provides a first memory module with all of its data, while a second set of I/Os provides a second memory module with all of its data. More or less memory modules may be employed. One example of a dynamic point-to-point memory architecture is shown in U.S. Pat. No. 8,769,234, titled Memory Modules and Devices Supporting Configurable Data Widths, which issued on Jul. 1, 2014, assigned to the Assignee of the present application, and expressly incorporated herein by reference in its entirety.

Further referring to FIG. 5A, a motherboard wiring pattern is shown, generally designated 500, that includes a first set of contact pads 502 representing groups of I/O pads associated with a memory controller. Six other sets of contact pads 504, 506, 508, 510, 512 and 514 are provided that represent groups of contacts for mounting respective memory modules. The memory modules are configured such that varying numbers of the modules may be used, while still providing point-to-point connections with the memory controller. For circumstances where not all of the memory module slots are intended to be used, a continuity module may be employed. A continuity module does not include memory devices, but merely passes connections from the memory controller on to another memory module. As can be seen from FIG. 5A, each memory controller I/O from the set of contact pads 502 terminates at a single contact pad from one of the sets of memory module contacts. As an example, contact pad group 520 is routed along path 522 in a point-to-point manner to contact group 524, which corresponds to the group of contacts 512. The other contacts of the memory controller are routed in a similar fashion. Other routings are also made, on the mother board itself, to provide for point-to-point connections in the event that continuity modules are used. For example, contact group 526, belonging to the first group of module contacts 504, is routed to contact group 528, which belongs to module group 514, along path 530.

FIG. 5B illustrates further detail of a point-to-point configuration where two memory modules 532 and 534 are installed on the motherboard wiring pattern of FIG. 5A, at module contact locations 506 and 514. Continuity modules 536, 538, 540 and 542 are installed in the remaining contact locations 504, 508, 510 and 512. This configuration provides for a point-to-point connection from the first memory controller I/O contact 520, along motherboard path 544, to continuity module 542, where the path is internally routed to contact 546, then connected via motherboard path 548 to module contact 550 of the last group of module contacts 514. The other memory controller I/Os are routed similarly, as shown in FIG. 5B. The end result of the point-to-point routing is to supply the data from three groups of I/Os (half of the six shown) to each module.

While FIG. 5B shows a 2-module point-to-point topology, a six module topology is illustrated in FIG. 5C, where all of the contact slots are filled with memory modules. In a similar manner as that described above with respect to the 2-module configuration, a given subset of the memory controller I/O's are dedicated to supplying all of the data to a given memory module. Thus, in FIG. 5C, the single memory controller I/O provides all of the data to a single module via the routing configurations described above and shown in FIG. 5A. While not shown, the point-to-point routing scheme described above may apply to any number of I/Os and modules, depending on the application.

Figure 6:
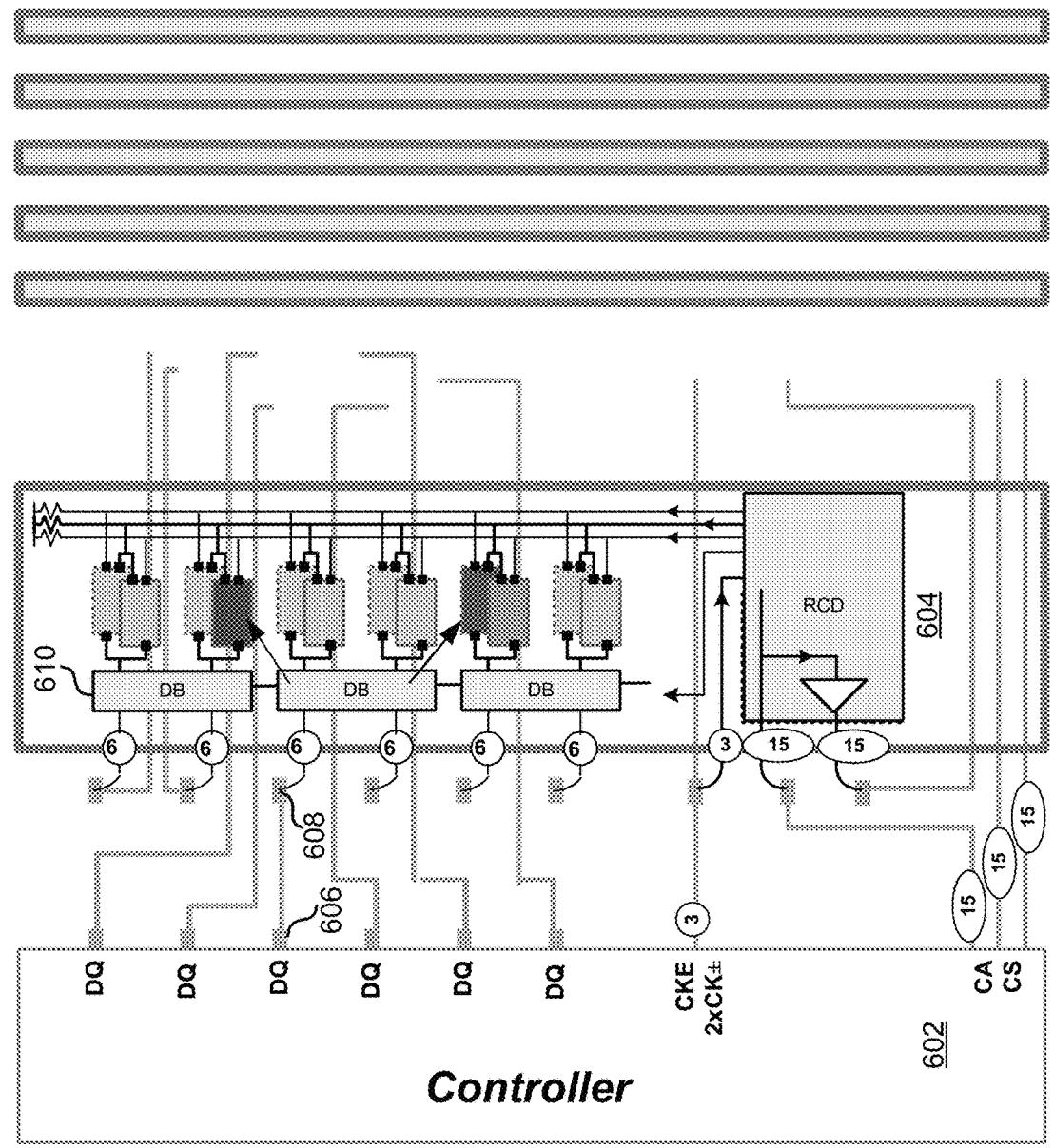
FIG. 6 illustrates further detail for one specific embodiment of a buffered memory module configured for a point-to-point system topology.

In one embodiment, the buffered module data transfer methodology of FIGS. 1-4, where a primary interface may transfer data at a rate higher than a secondary interface transfer rate, may be employed in a point-to-point topology, such as the examples shown in FIGS. 5A-5C. FIG. 6 illustrates a memory controller 602, and a memory module 604. For purposes of clarity, only one memory module is shown, with the understanding that multiple memory modules are connected to the memory controller 602 in a point-to-point configuration. Each memory module is formed similarly to those described above with respect to FIGS. 1 and 2, although the buffer circuitry includes logic to configure data distribution among the memory devices in the module.

Further referring to FIG. 6, one embodiment of the memory controller 602 includes multiple sets of I/O contacts (each set corresponding to, for example, six paths) coupled to corresponding I/Os. Only one of the sets of I/Os, at 606, is connected to the memory module, at 608. All of the data transferred between the module 604 and the memory controller 602 is routed through the dedicated I/O set. For one embodiment, data buffers 610 on the module 604 form distributed buffer logic that coordinates the transfer of the data from the connection at 608 into appropriate nibbles for directed routing along secondary data paths to appropriate memory devices on the module. For one embodiment, the secondary data rate is half the primary data transfer rate.

For one embodiment, a given data transfer to a given module may involve concurrent accesses to a first group of memory devices on one side of the module, and a second group of memory devices on a second side of the module. Separate secondary data paths may be provided to the front and back devices to accomplish this. Additionally, the point-to-point data transfers between the memory controller 602 and modules 604 may be error coded. The error encoding may be generated in accordance with one of many acceptable EDC algorithms including, for example, straightforward single-bit Hamming codes, to more sophisticated high-speed BCH (Bose, Ray-Chaudhuri and Hocquenghem) codes. Other EDC codes, such as "Chipkill" codes, Reed-Solomon codes, turbo codes, cyclic redundancy codes (CRC) and low density parity check (LDDC) codes may also be acceptable.

Figure 7:
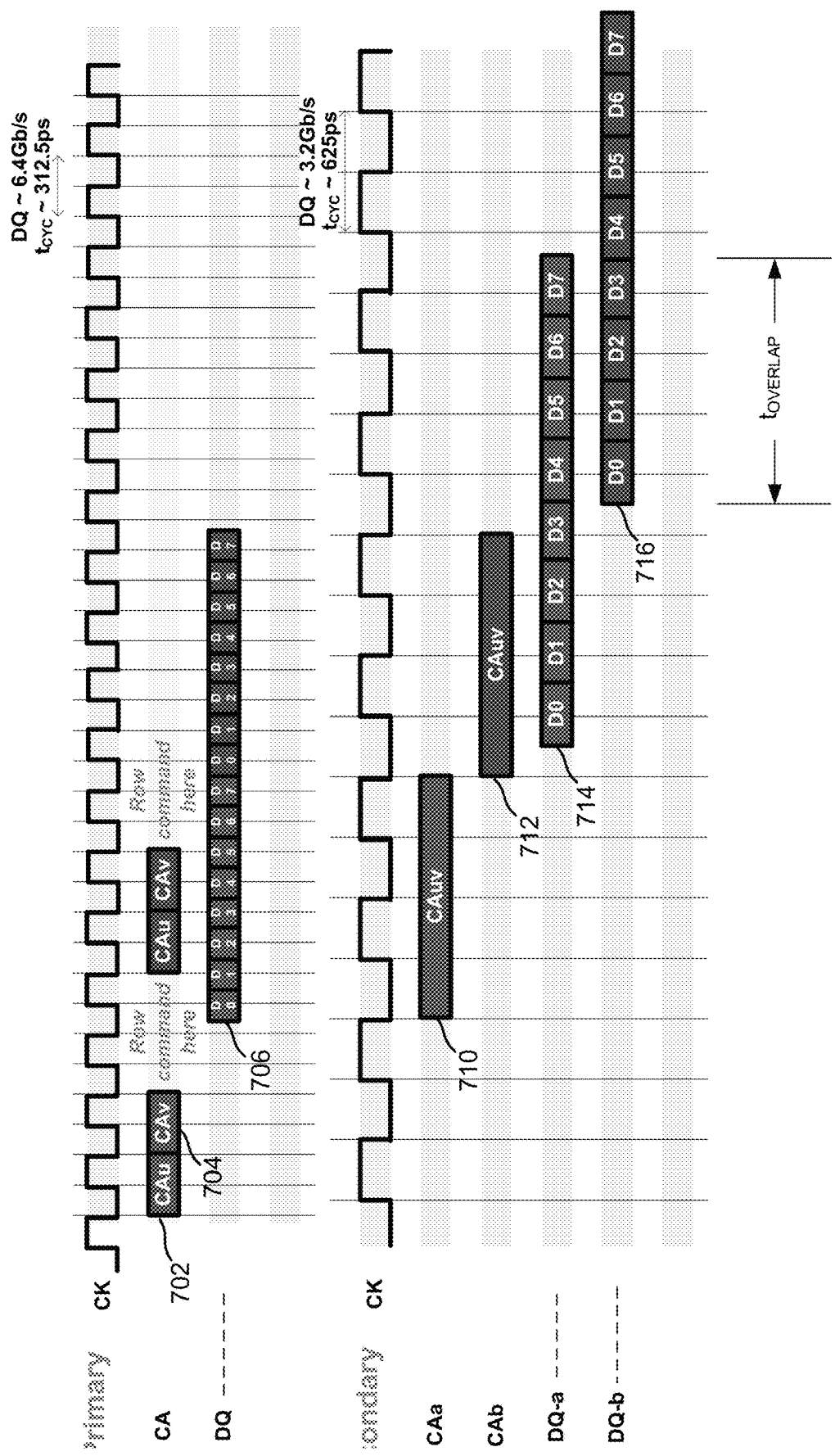
FIG. 7 illustrates a timing diagram for data and command signals associated with the buffered memory module of FIG. 6.

FIG. 7 illustrates a timing diagram similar to the diagram of FIG. 3, for a point-to-point transfer of data from the memory controller 602 to a first module 604, with the understanding that similar point-to-point transfers occur simultaneously involving one or more other modules. Respective column commands $CA_U$ and $CA_V$ are dispatched along a CA primary bus at a first bit transfer rate, at 702 and 704. First and second column data corresponding to the column commands are then transferred along a primary set of point-to-point links, at 706. The column access commands are then received by CA buffer circuitry, and re-transmitted along the secondary CA bus at a transfer rate that is half the primary CA transfer rate, at 710 and 712. The first and second data is then received by the data buffer circuitry, and the first data is directed to a first group of memory devices, at 714. The second data is directed to a second group of memory devices, at 716. The data transfers along the secondary data paths are at a rate that is half the primary data rate, and carried out at least partly concurrently, where an overlap in time $t_{OVERLAP}$ exists between the data transfers. Other data rate ratios may be employed between the primary and secondary interfaces, depending on the application and system topology.

Those skilled in the art will appreciate that the embodiments described above allow for optimum bandwidth utilization along respective primary and secondary signaling paths associated with buffered memory architectures. By transferring data along a primary signaling path at a rate higher than a signaling rate along a secondary signaling path, less costly memory devices may be employed, reducing the overall costs of the memory system. Further, by optimizing the respective primary and secondary signaling bandwidth efficiencies, performance improvements in the memory system may be realized.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '☐signalname☐') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A memory module, comprising:
    a module substrate;
    a first memory device and a second memory device, the first memory device and the second memory device disposed on the module substrate;
    buffer circuitry disposed on the module substrate, the buffer circuitry comprising:
       a primary interface for coupling to a group of links associated with a memory controller, the primary interface operating at a primary data signaling rate;
       a secondary interface including a first signal path for coupling to the first memory device, and a second signal path for coupling to the second memory device, the first signal path and the second signal paths operating at a secondary data signaling rate;
    wherein during a first mode of operation, the primary data signaling rate is at least twice the secondary data signaling rate, and wherein a first time interval associated with a transfer of first information via the first signal path temporally overlaps a second time interval involving second information transferred via the second signal path.

2. The memory module according to claim 1, wherein:
    the primary interface is for coupling to the memory controller via a subset of the group of links in a point-to-point manner.

3. The memory module according to claim 1, wherein:
    the primary interface is for coupling to the memory controller via all of the group of links in a multi-drop manner.

4. The memory module according to claim 1, wherein:
    the first information and the second information are transferred in an interleaved manner at the primary interface.

5. The memory module according to claim 1, wherein:
    during a second mode of operation, the primary data signaling rate corresponds to the secondary data signaling rate.

6. The memory module according to claim 1, wherein:
    the secondary interface performs transfers of the first information and the second information that are carried out in accordance with a dynamic random access memory (DRAM) protocol.

7. The memory module according to claim 1, wherein:
    the primary interface comprises a primary data interface for transferring data.

8. The memory module according to claim 1, wherein:
    the primary interface comprises a primary control/address (C/A) interface for receiving control and address signals at a first control signal rate from the memory controller; and wherein the secondary interface comprises a secondary C/A interface that transfers control and address signals at a second control signal rate to the first memory device and the second memory device, and wherein the first control signal rate is at least twice the second control signal rate.

9. A method of operation in a memory module, the method comprising:
    buffering a first memory device and a second memory device from a memory controller, the buffering including
       interfacing with the memory controller via a group of links coupled to a primary interface;
       interfacing with the first memory device and the second memory device via a first secondary interface and a second secondary interfaces;
       operating the first secondary interface and the second secondary interface at a secondary data signaling rate;
    configuring the memory module to operate in either a first mode of operation or a second mode of operation, wherein during the first mode of operation,
       operating the primary interface at a primary data signaling rate that is at least twice the secondary data signaling rate;
       transferring first information via the first secondary interface during a first time interval; and
       transferring second information via the second secondary interface during a second time interval that temporally overlaps the first time interval.

10. The method of claim 9, wherein the interfacing with the memory controller further comprises:
    interfacing with the memory controller via a subset of the group of links coupled to the primary interface in a point-to-point manner.

11. The method of claim 9, wherein the interfacing with the memory controller further comprises:
    interfacing with the memory controller via all of the group of links coupled to the primary interface in a multi-drop manner.

12. The method of claim 9, further comprising:
    transferring the first information and the second information in an interleaved manner via the primary interface.

13. The method of claim 9, further comprising:
    during the second mode of operation, operating the primary interface at a primary data signaling rate that corresponds to the secondary data signaling rate.

14. The method of claim 13, further comprising:
    transferring the first information and the second information via the first secondary interface and the second secondary interfaces in accordance with a dynamic random access memory (DRAM) protocol.

15. A dynamic random access memory (DRAM) module, comprising:
    a module substrate;
    a first DRAM device and a second DRAM device, the first DRAM device and the second DRAM device disposed on the module substrate;
    buffer circuitry disposed on the module substrate, the buffer circuitry comprising:
       primary interface circuitry for coupling to a group of links associated with a dynamic random access memory (DRAM) memory controller, the primary interface circuitry operating at a primary data signaling rate;
       secondary interface circuitry including a first signal path for coupling to the first DRAM device, and a second signal path for coupling to the second DRAM device, the first signal path and the second signal paths operating at a secondary data signaling rate;

configuration circuitry to place the buffer circuitry in a first mode of operation or a second mode of operation; and wherein during the first mode of operation, the primary data signaling rate is at least twice the secondary data signaling rate, and wherein a first time interval associated with a transfer of first information via the first signal path temporally overlaps a second time interval involving second information transferred via the second signal path.

16. The DRAM module according to claim 15, wherein: during the second mode of operation, the primary data signaling rate corresponds to the secondary data signaling rate.

17. The DRAM module according to claim 15, wherein: the primary interface circuitry is for coupling to the DRAM memory controller via a subset of the group of links in a point-to-point manner.

18. The DRAM module according to claim 15, wherein: the primary interface circuitry is for coupling to the DRAM memory controller via all of the group of links in a multi-drop manner.

19. The DRAM module according to claim 15, wherein: the primary interface circuitry comprises a primary data interface for transferring data.

20. The DRAM module according to claim 15, wherein: the primary interface circuitry comprises a primary control/address (C/A) interface for receiving control and address signals at a first control signal rate from the DRAM memory controller; and wherein the secondary interface circuitry comprises a secondary C/A interface that transfers control and address signals at a second control signal rate to the first DRAM device and the second DRAM device, and wherein the first control signal rate is at least twice the second control signal rate.

\* \* \* \* \*